(12) United States Patent
Watanabe

(10) Patent No.: US 6,809,345 B2
(45) Date of Patent: Oct. 26, 2004

(54) SEMICONDUCTOR LIGHT EMITTING ELEMENT AND SEMICONDUCTOR LIGHT EMITTING DEVICE

(75) Inventor: Yukio Watanabe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/601,086

(22) Filed: Jun. 20, 2003

(65) Prior Publication Data

US 2004/0041157 A1 Mar. 4, 2004

(30) Foreign Application Priority Data

Jun. 26, 2002 (JP) ........................... 2002-186012

(51) Int. Cl.$^7$ ............................................. H01L 33/00
(52) U.S. Cl. ............................................ 257/99; 257/98
(58) Field of Search .................... 257/79–103

(56) References Cited

U.S. PATENT DOCUMENTS

| | | | | |
|---|---|---|---|---|
| 5,087,949 A | * | 2/1992 | Haitz | ........................... 257/79 |
| 5,349,211 A | * | 9/1994 | Kato | ........................... 257/90 |
| 5,357,122 A | * | 10/1994 | Okubora et al. | .............. 257/84 |
| 5,610,412 A | * | 3/1997 | Awano et al. | ................. 257/85 |
| 6,229,160 B1 | * | 5/2001 | Krames et al. | ............... 257/94 |

FOREIGN PATENT DOCUMENTS

| | | |
|---|---|---|
| JP | 03-035568 | 2/1991 |
| JP | 04-096381 | 3/1992 |

* cited by examiner

Primary Examiner—Shouxiang Hu
(74) Attorney, Agent, or Firm—Hogan & Hartson, LLP

(57) ABSTRACT

A semiconductor light emitting element and a semiconductor light emitting device, which are high in optical output, uniform in emission of light and high in production yield and productivity, comprise: an electrically conductive transparent substrate having a first surface and a second surface opposed to each other; a semiconductor epitaxial layer formed on a location of the first surface of the substrate; a first electrode formed on the semiconductor epitaxial layer; a second electrode formed on a location of the second surface of the substrate offset from alignment with the first electrode; and a groove formed to indent from the second surface of the substrate toward the first surface in a location between the first electrode and the second electrode.

18 Claims, 9 Drawing Sheets

SEMICONDUCTOR LIGHT EMITTING ELEMENT AND SEMICONDUCTOR LIGHT EMITTING DEVICE

CROSS-REFERENCE TO RELATED APPLICATIONS

This application is based upon and claims the benefit of priority from the prior Japanese Patent Application No. 2002-186012, filed on Jun. 26, 2002, the entire contents of which are incorporated herein by reference.

BACKGROUND OF THE INVENTION

1. Field of the Invention

This invention generally relates to a semiconductor light emitting element and a semiconductor light emitting device.

2. Related Background Art

Semiconductor light emitting elements are elements that make use of luminescent recombination of electrons and holes injected into pn junctions to emit light from their active layers. They are remarked as inexpensive, long-lifetime light emitting elements.

An issue with such semiconductor light emitting elements is enhancement of light output by enhancing the internal emission efficiency and the light extraction efficiency. Semiconductors in general have higher refractive indices than air. Therefore, only a part of light output inside a semiconductor light emitting element can be extracts externally, and the remainder is reflected back at the interface between the semiconductor light emitting element and air. Therefore, enhancement of the light extraction efficiency is one of issues of semiconductor light emitting elements.

FIG. 20 shows an existing light emitting element disclosed in Japanese Patent Laid-Open Publication No. hei 3-35568. The element includes a bonding substrate 31 transparent to its own emission wavelength, light emitting diode layer 32 and silica layer 33 that are sandwiched between ohmic electrodes 34, 35. A method usable for manufacturing such a semiconductor light emitting element is briefly explained below.

In the first step, the light emitting diode layer 32 is grown on an opaque substrate not shown. Then a bondage substrate 31 transparent to the wavelength of light emitted in the light emitting diode layer 32 is bonded to the light emitting diode layer 32 on the substrate. After that, the opaque substrate, not shown, is removed to obtain an intermediate semiconductor light emitting element. In the next step, the silica layer 33 for concentrating the current to a central part of the light emitting diode layer 32 is formed on the light emitting diode layer 32 as shown in FIG. 20. Thereafter, one of the electricity-conducting ohmic electrodes is formed on the transparent substrate 31, and the other electricity-conducting ohmic electrode 35 is formed over the light emitting diode layer 32 and the silica layer 33, as shown in FIG. 20. After that, through dicing and/or other steps, the semiconductor light emitting element is finally configured quasi hemispherical as shown in FIG. 20.

The semiconductor light emitting element shown in FIG. 20 enhances the light extraction efficiency to some extent by configuring quasi hemispherical.

However, the semiconductor light emitting element shown in FIG. 20 suffers partial blockage of light emitted in the light emitting diode layer 32 by the opaque ohmic electrode 34. Therefore, it could not be sufficiently enhanced in light extraction efficiency.

FIG. 21 shows another existing semiconductor light emitting element disclosed in Japanese Patent Laid-Open Publication No. hei 4-96381. The element includes an AlGaAs thick-film substrate 37, p-type AlGaAs clad layer 38, AlGaAs active layer 39, and n-type AlGaAs clad layer 40 as shown in FIG. 21. This semiconductor light emitting element further includes a semiconductor multi-layered reflective film 41, cap layer 42, Zn-diffused portions 43, p-side electrode 44, and n-side electrode 45. For the purpose of efficiently extracting light emitted in the AlGaAs active layer 39, the semiconductor light emitting element is configured to induce emission of light in a central part of the hemispherical dome.

The semiconductor light emitting element shown in FIG. 21 uses the substrate 37 that is transparent and hemispherical, and locates the opaque electrodes 44, 45 on the surface opposite from the light-extracting surface. Therefore, the semiconductor light emitting element of FIG. 21 is higher in light extraction efficiency than the element of FIG. 20.

However, the element of the type shown in FIG. 21 involves the problem that the production yield or productivity is inevitably low because of extreme difficulty of its mounting. In greater detail, for manufacturing the semiconductor light emitting element of FIG. 21, grooves must be made for isolating the p-side electrode 44 from the n-side electrode 45, and a manufacturing process of Zn-diffused portions 43 is indispensable. These factors made the manufacturing process of the element of FIG. 21 very difficult. Additionally, since the p-side electrode 44 and the n-side electrode 45 are closely located, these electrodes 44, 45 are liable to be short-circuited by a spread of an electrically conductive mounting material during or after the mounting of the element. Furthermore, since those two electrodes 44, 45 need simultaneous positioning, severe preciseness is required for positioning the electrode on the part of the reflector (mounting stem) and the electrodes 44, 45 of the element. These factors inevitably worsened the production yield and the productivity. Furthermore, in the semiconductor light emitting element shown in FIG. 1, a current is injected abeam to the light emitting portion in the central portion of the dome, and this caused uneven emission of light.

As explained above, it has been impossible heretofore to obtain a semiconductor light emitting element high in light extraction efficiency, uniform in emission of light and high in production yield and productivity.

SUMMARY OF THE INVENTION

According to embodiments of the present invention, there is provide a semiconductor light emitting element comprising:

a transparent first conduction type substrate having a first surface and a second surface opposed to each other and being transparent to light of a wavelength λ;

a semiconductor epitaxial layer formed on a location of the first surface of the substrate directly or via a buffer layer, and including a semiconductor layer of a first conduction type formed in electrical connection with the substrate, an active layer formed on the semiconductor layer of the first conduction type to emit light of the wavelength λ and a semiconductor layer of a second conduction type formed on the active layer;

a first electrode formed in electrical connection with the semiconductor layer of the second conduction type of the semiconductor epitaxial layer on a location of a surface of the semiconductor epitaxial layer opposite from the substrate;

a second electrode formed in electrical connection with the substrate on a location of the second surface of the substrate offset from alignment with the first electrode; and a groove formed to indent from the second surface of the substrate toward the first surface thereof in a location between the first electrode and the second electrode.

According to embodiments of the present invention, there is provide a semiconductor light emitting device comprising:

a semiconductor light emitting element having:

a transparent first conduction type substrate having a first surface and a second surface opposed to each other and being transparent to light of a wavelength λ;

a semiconductor epitaxial layer formed on a location of the first surface of the substrate directly or via a buffer layer, and including a semiconductor layer of a first conduction type formed in electrical connection with the substrate, an active layer formed on the semiconductor layer of the first conduction type to emit light of the wavelength λ and a semiconductor layer of a second conduction type formed on the active layer;

a first electrode formed in electrical connection with the semiconductor layer of the second conduction type of the semiconductor epitaxial layer on a location of a surface of the semiconductor epitaxial layer opposite from the substrate;

a second electrode formed in electrical connection with the substrate on a location of the second surface of the substrate offset from alignment with the first electrode; and a groove formed to indent from the second surface of the substrate toward the first surface thereof in a location between the first electrode and the second electrode;

a reflector; and an electrically conductive mounting material for mounting the first electrode of the semiconductor light emitting element on the reflector.

According to embodiments of the present invention, there is further provide a semiconductor light emitting device comprising:

a semiconductor light emitting element having:

a GaP substrate of a first conduction type, having a first surface and a second surface opposed to each other and being translucent to light of a wavelength λ;

a semiconductor epitaxial layer formed on a location of the first surface of the substrate via a buffer layer of a GaP compound semiconductor, and including a semiconductor layer of a first conduction type formed in electrical connection with the GaP substrate, an active layer formed on the semiconductor layer of the first conduction type to emit light of the wavelength λ, a semiconductor layer of a second conduction type formed on the active layer, a reflective layer of the second conduction type formed on the semiconductor layer of the second conduction type to reflect light of the wavelength λ, and a contact layer of the second conduction type formed on the reflective layer, the semiconductor layer of the first conduction type, the active layer and the semiconductor layer of the second conduction type being made of InGaAlP compound semiconductor and being different in lattice constant and material from the GaP substrate, the contact layer of the second conduction type being made of a GaAs compound semiconductor;

a first electrode formed on a location of the contact layer of the second conduction type in electrical connection therewith;

a second electrode formed on a location of the second surface of the substrate in electrical connection therewith; and a wedge-shaped groove formed to indent from the second surface of the substrate toward the first surface thereof in a location between the first electrode and the second electrode, and having a pass-through surface portion permitting the light from the active layer to pass through externally of the substrate and a reflective surface portion for reflecting light passing through the pass-through surface potion;

a reflector; and an electrically conductive mounting material for mounting the first electrode of the semiconductor light emitting element on the reflector.

DETAILED DESCRIPTION OF THE INVENTION

Figure 1:
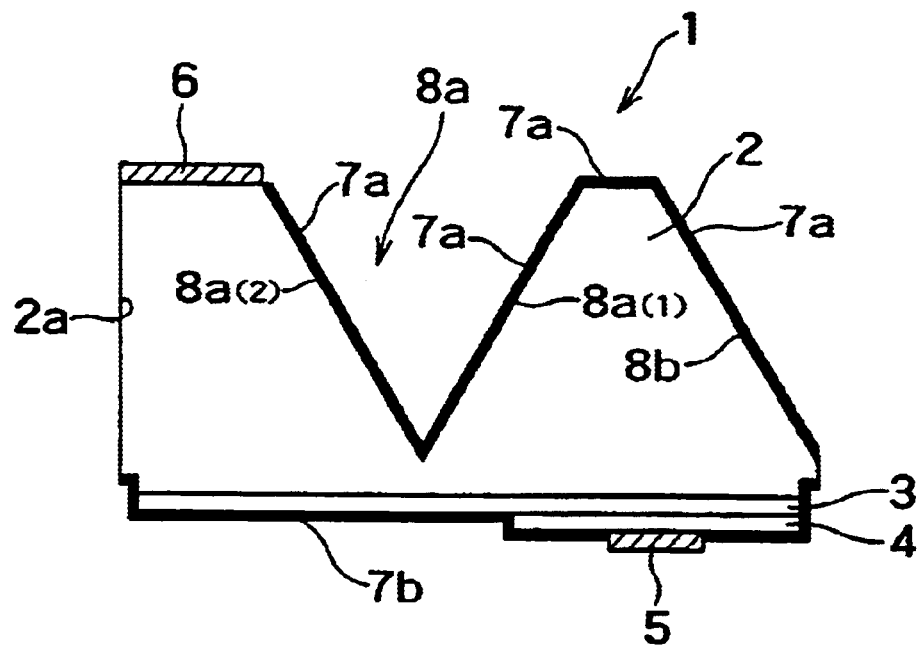
FIG. 1 is a cross-sectional view of a semiconductor light emitting element according to an embodiment of the invention.

The semiconductor light emitting element and the semiconductor light emitting device according to embodiments of the invention will now be explained below with reference to the drawings. One of features of embodiments of the invention lies in: using a substrate 2 transparent to light from a semiconductor epitaxial layer 4 in the semiconductor light emitting element configured to emit light from the semiconductor epitaxial layer 4 by injection of a current from an n-side electrode (first electrode) 5 and a p-side electrode (second electrode) 6; locating the p-side electrode 6 offset from the position in alignment with the n-side electrode 5; and forming a groove 8a in a location between the p-side electrode 6 and the n-side electrode 5. Accordingly, the upper part of the transparent substrate 2 above the semiconductor epitaxial layer 4 is shaped quasi hemispherical, and the p-side electrode 6 does not interrupt the light from the semiconductor epitaxial layer 4, the semiconductor light emitting device can be enhanced in light extraction efficiency.

FIG. 1 is a cross-sectional view showing the semiconductor light emitting element 1 according to one of embodiments of the invention. The p-type GaP substrate 2 has a first surface (the lower surface in the drawing) and a second surface (the upper surface in the drawing) that oppose each other. On a part of the lower surface, the semiconductor epitaxial layer 4 is formed via a buffer layer 3. The n-side electrode (first electrode) 5, which is one of the electrodes of the element, is formed on a part of one surface of the semiconductor epitaxial layer 4 opposite from the substrate 2. The other electrode, p-side electrode (second electrode) 6, is formed on a part of the upper surface of the substrate 2 in electrical connection with the substrate 2. The position of the p-side electrode 6 is offset from direct confrontation with the n-side electrode 5.

In the element of FIG. 1, when a current is injected from the p-side electrode 6 and the n-side electrode 5, light of the wavelength λ is emitted from the semiconductor epitaxial layer 4. The substrate 2 is transparent to light of the wavelength λ. That is, the substrate 2 is a transparent substrate in this element. The p-side electrode 6 and the n-side electrode 5, however, are opaque to this light.

In the element of FIG. 1, the groove 8a is located between the p-side electrode 6 and the n-side electrode 5. The groove 8a is formed to indent the substrate 2 from the upper surface toward the lower surface thereof. The groove 8a is defined by two surfaces, namely, the first surface 8a(1) and the second surface 8a(2), to form a wedge-shaped section. In greater detail, in a view of the p-type GaP transparent substrate 2 taken from a plane parallel to the sheet plane, the first and second surfaces 8a(1) and 8a(2) extend across between the p-side electrode 6 and the n-side electrode 5. The first surface 8a(1) serves as a pass-through surface that permits light from semiconductor epitaxial layer 4 to pass through externally. The second surface 8a(2) serves as a reflective surface that reflects the light passing through the pass-through surface 8a(1). The groove 8a optically separates these two electrodes 7 and 5. The use of the groove 8a contributes to enhancing the optical output as explained later.

The structure of the semiconductor epitaxial layer 4 is next explained in greater detail with reference to FIG. 2 that is a cross-sectional view showing details of the semiconductor epitaxial layer of the semiconductor light emitting element of FIG. 1. The semiconductor epitaxial layer 4 includes p-type (first conduction type) semiconductor layers 13 through 11 formed in electrical connection to the p-type GaP substrate 2. In greater detail, these p-type semiconductor layers 13 through 11 are, respectively, a bonding layer 13 made of p-type InGaP, current diffusion layer 12 made of p-type InGaAlP, and p-type clad layer 11 made of $In_{0.5}Al_{0.5}P$. The bonding layer 13 is the layer to be bonded to the buffer layer 3 already explained. The current diffusion layer 12 functions to spread out a current from the p-side electrode 6 horizontally in the illustration and delivers it to a light emitting layer 14. Sequentially formed on the p-type semiconductor layers 13 through 11 are: an active layer 10 made of an InGaAlP material to emit light of the wavelength λ in response to injection of a current; an n-type clad layer 9 made of $In_{0.5}Al_{0.5}P$; a reflective layer 8 made by alternately stacking InAlP layers and GaAlAs layers to reflect light of the wavelength λ; and an n-type contact layer 7 made of GaAs. In the semiconductor epitaxial layer 4 of FIG. 2, the active layer 10 has a MQW structure.

Figure 2:
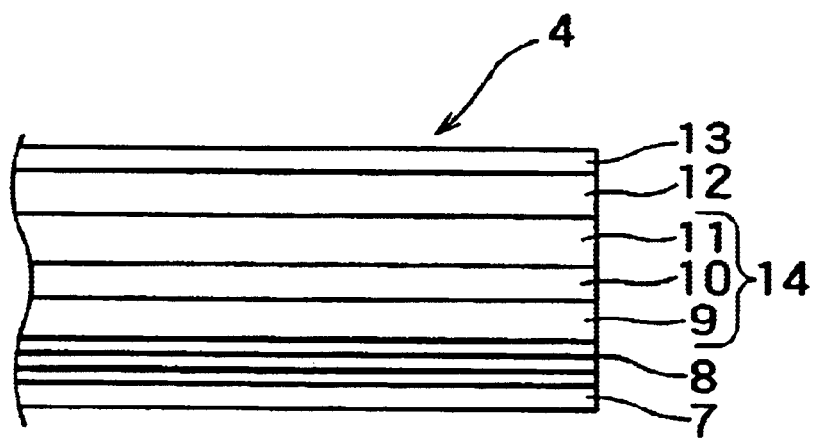
FIG. 2 is a cross-sectional view showing a concrete form of a semiconductor epitaxial layer in the semiconductor light emitting element according to the embodiment of the invention.

In the semiconductor epitaxial layer 4 of FIG. 2, the active layer 10 emits light of the wavelength λ mainly in the upper and lower directions in the drawing. The active layer 10 is enhanced in emission intensity by the cladding layers 9, 11 sandwiching it. Thus the structure can be regarded that the n-type clad layer 9, active layer 10 and p-type clad layer 11 altogether form the emission layer 14 and the emission layer 14 emits light. Light emitted upward in the drawing from the emission layer 14 is irradiated externally through the transparent substrate 2. Light emitted from downward in the drawing from the emission layer 14 is reflected upward in the drawing by the reflective layer 8, and irradiated externally through the transparent substrate 2 as well.

Figure 3:
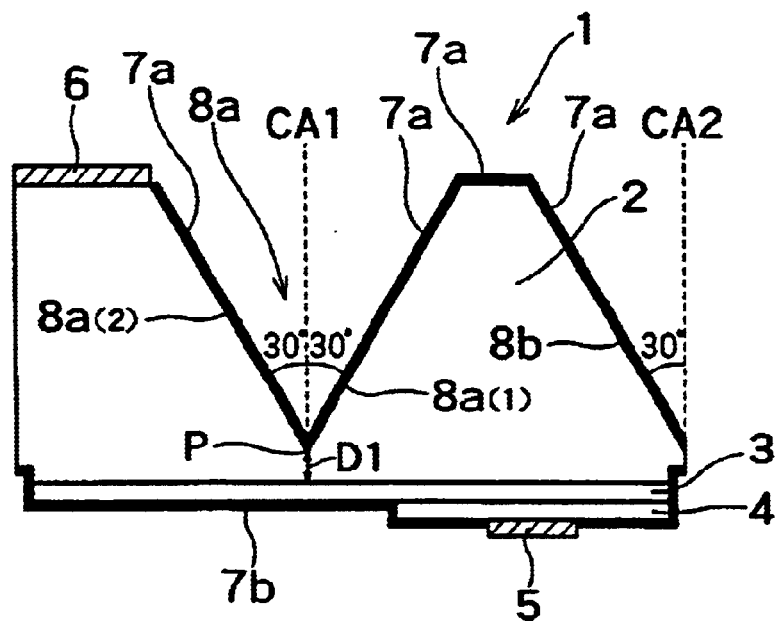
FIG. 3 is a cross-sectional view showing a concrete structure of grooves in the semiconductor light emitting element of FIG. 1.
Figure 4:
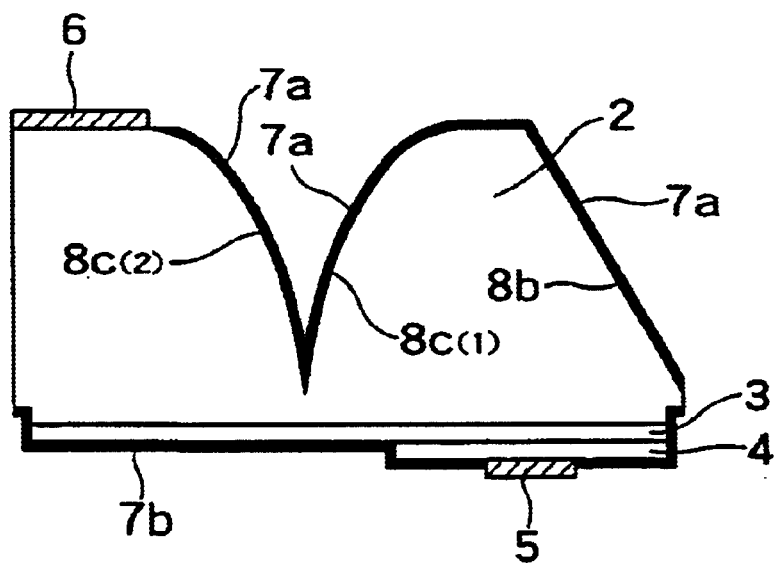
FIG. 4 is a cross-sectional view showing modified grooves in the semiconductor light emitting element of FIG. 1.

The groove 8a in the semiconductor light emitting element of FIGS. 1 and 2 is next explained in greater detail. FIG. 3 is a cross-sectional view showing a detailed structure of the groove 8a. As shown in FIG. 3, the first surface 8a(1) is inclined from the center axis CA1 to prevent total internal reflection of light from the emission layer 14. More specifically, the first surface 8a(1) inclines by approximately 30° from the center axis CA1. The second surface 8a(2) is also inclined by approximately 30° from the center axis CA1 but oppositely from the first surface 8a(1) to reflect light once emanating from the first surface 8a(1) and entering into the outer surface of the second surface 8a(2) in the upward direction in the drawing. That is, the second surface 8a(2) is configured to prevent that the light emanating from the first surface 8a(1) again enters inside the semiconductor light emitting element 1, especially into below the p-side electrode 6. Furthermore, as shown in FIG. 4, the groove 8a is made as deep as possible to guide a maximum part of the light externally and thereby enhance the light extraction efficiency. That is, the groove 8a is deepened so as to reduce the thickness D1 of the transparent substrate 2 along the ridgeline where the first surface 8a(1) and the second surface 8a(2) meet. Therefore, it can be expressed that the p-side electrode 6 and the n-side electrode 5 (emission layer 14) are optically isolated from each other. Still referring to FIG. 3, the inclined surface 8b inclines by approximately 30° from the center axis CA2 to guide the light from the emission layer 14 externally without being totally reflected.

Still referring to FIG. 3, an oxide (insulating oxide) 7a is formed as a reflection-preventing film on the first surface 8a(1) for reliably preventing reflection of the light from the emission layer 14 at the first surface 8a(1). For the same purpose, an oxide 7a is formed also on the inclined surface 8b and the top surface. Furthermore, a similar oxide 7a is formed as well on the second surface 8a(2) for preventing absorption. The oxide 7a is made of $SiO_2$ or $Al_2O_3$ that is transparent to the wavelength of the light. Thickness of the oxide 7a is adjusted to be odd number times of $\lambda/4n$ relative to the wavelength $\lambda$ of the light and the refractive index n of the oxide 7a.

In addition, for the purpose of preventing short-circuiting between the p-type layers 13 through 11 and the n-type layer 9 through 7, an oxide 7b as an insulating film is formed on side surfaces of the semiconductor epitaxial layer 4 and a part of the semiconductor epitaxial layer 4 opposite from the substrate 2 (the lower surface in the drawing) excluding the surface thereof covered by the first electrode 5. This oxide 7b may be identical to the oxide 7a in material and thickness. The oxide 7b additionally covers the lower surface and side surfaces of the p-type GaP buffer layer 3 as well. Thickness of the oxide 7b is also adjusted to be odd number times of $\lambda/4n$ to enhance the transmittance for the emitted light.

In the semiconductor light emitting element 1, a reflective material like an electrode material may be provided in the oxide 7a. Alternatively, a reflective material like an electrode material may be provided in lieu of the oxide 7a on the second surface 8a(2). In the semiconductor light emitting element 1 explained above, the groove 8a is V-shaped. However, it may be modified as shown in FIG. 4 where the first surface 8c(1) and the second surface 8c(2) curve. In FIG. 4, components identical or equivalent to those of FIG. 3 are labeled with common reference numerals, and their explanation is omitted here.

Next referring to FIG. 5, explanation will be made on a semiconductor light emitting device using the semiconductor light emitting element already explained in conjunction with FIGS. 1 through 3.

Figure 5:
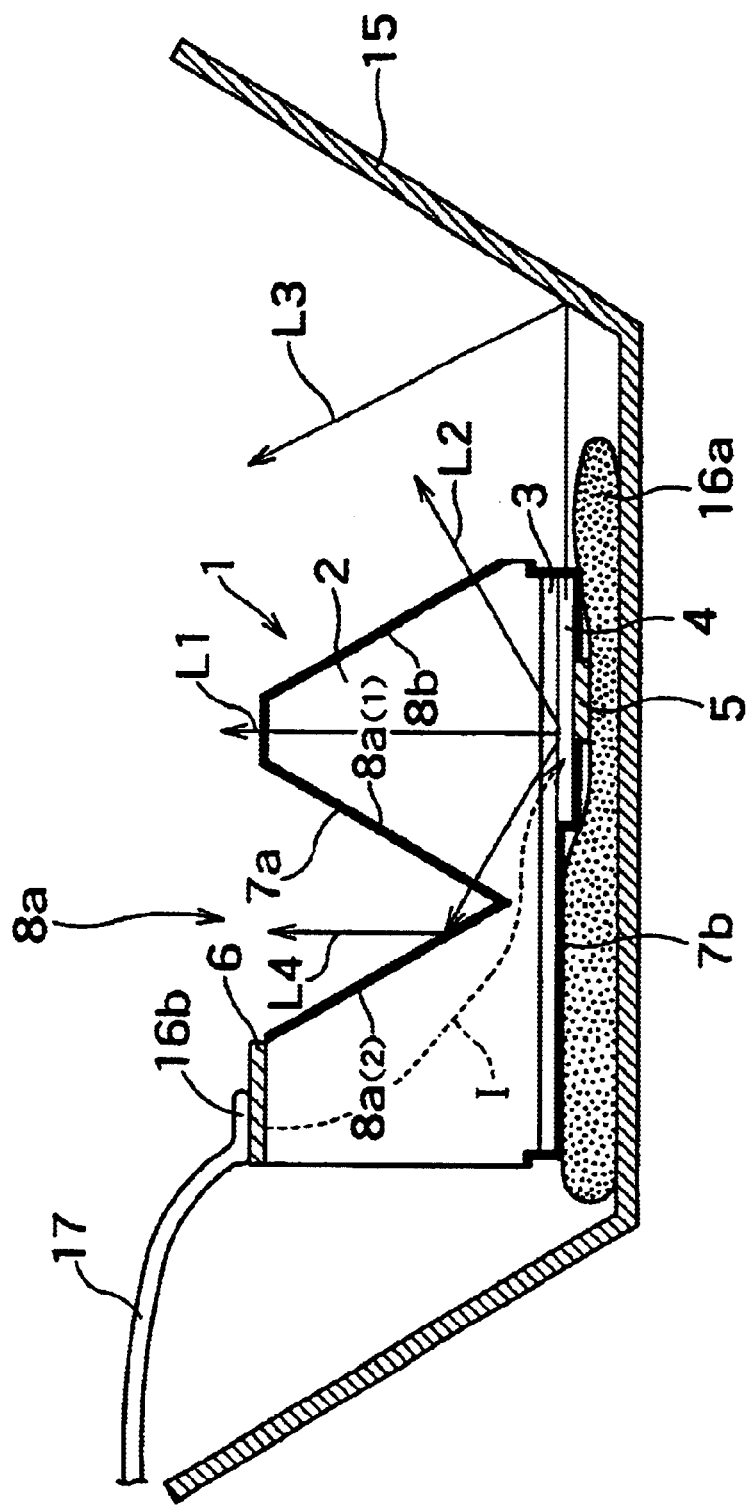
FIG. 5 is a cross-sectional view of a semiconductor light emitting device according to an embodiment of the invention.
Figure 8:
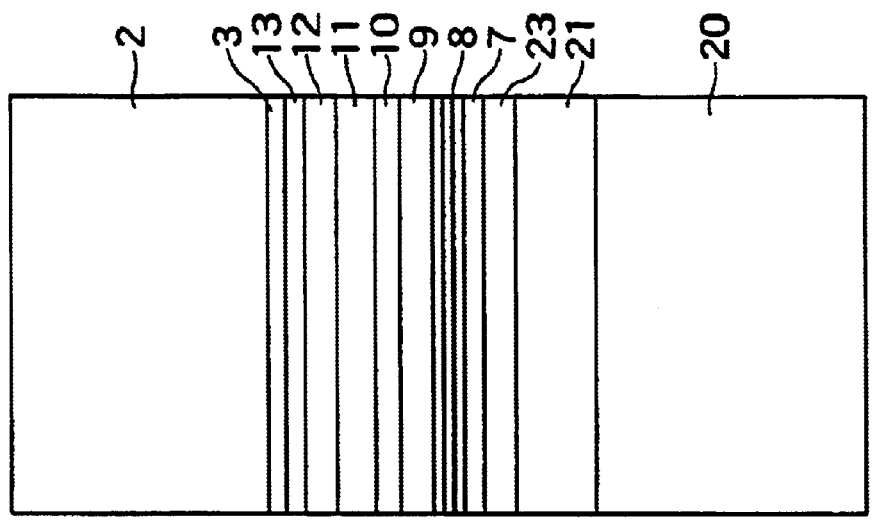
FIG. 8 is a cross-sectional view of the semiconductor light emitting device according to the same embodiment of the invention under a manufacturing process.

FIG. 5 is a cross-sectional view of a semiconductor light emitting device in which the above-explained semiconductor light emitting element 1 is mounted on a reflector 15 with a mounting material (paste) 16a. As shown in FIG. 5, the semiconductor light emitting element 1 is mounted on the reflector 15 for reflecting light emitted horizontally in the drawing toward the top of the semiconductor light emitting element 1 in the drawing so as to effectively use the light in the horizontal direction from the semiconductor epitaxial layer 4. In greater detail, the semiconductor light emitting element 1 is mounted on the reflector 15 with its n-side electrode 5 as the lower electrode by paste 16a such as silver. Further, a wiring 17 connected to a power supply (not shown) is bonded to the p-side electrode 6 as the upper electrode of the semiconductor light emitting element 1.

In the device with the semiconductor light emitting element mounted, when a current I from the power supply (not shown) is supplied through the p-side electrode 6 to the n-side electrode 5 as shown in FIG. 5, the emission layer 14 (see FIG. 2) emits light. The light is extracted as rays of light L1 through L4, for example, as shown in FIG. 5.

More specifically, light L1 is extracted from the top of the emission layer 14 in the drawing. The light L2 is extracted from the inclined surface 8b. The light L3 is once emitted in the horizontal direction of the emission layer 14 (see FIG. 2) in the drawing, thereafter reflected by the reflector 15 and extracted upward of the semiconductor light emitting element 1 in the drawing. The light L4 traveling toward the lower surface of the p-side electrode 6 passes through the first surface 8a(1) and the oxide film 7a, then reflects at the opposed second surface 8a(2), and it is extracted upward externally of the semiconductor light emitting element 1. That is, the light L4 traveling from the emission layer 14 toward the p-side electrode 6 is extracted externally without being interrupted by the p-side electrode 6. Light emitted downward from the emission layer 14 in the drawing is reflected upward in the drawing by the reflective layer 8 (FIG. 2), and extracted as the light L1 or L2. Light traveling downward in the drawing via the part of the buffer layer 3 without the semiconductor epitaxial layer 4 passes through the oxide 7b, it is reflected upward by the paste 16a, and extracted from the top in the drawing.

Next explained is a manufacturing method of the semiconductor light emitting element 1 with reference to FIGS. 6 through 19. FIGS. 6 through 19 are cross-sectional views and a top view of the semiconductor light emitting element 1 under respective steps of a manufacturing process used to show the manufacturing process.

Figure 6:
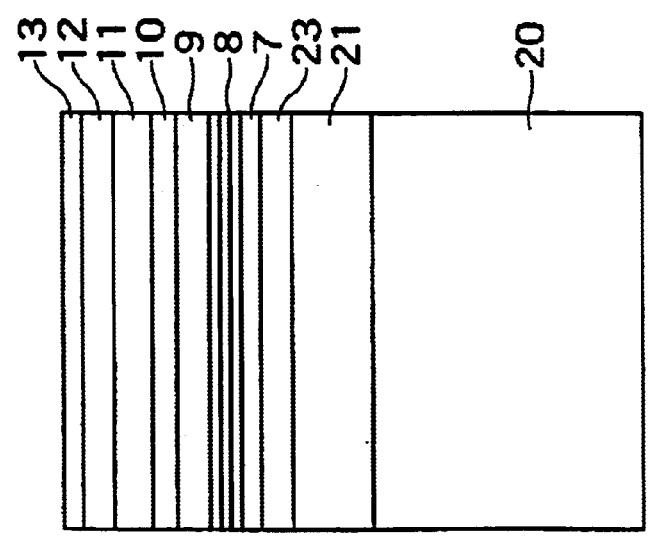
FIG. 6 is a cross-sectional view showing a semiconductor light emitting element according to an embodiment of the invention under a manufacturing process.

(1) First referring to FIG. 6, an n-type GaAs buffer layer 21, 0.5 μm thick, is grown on a 250 μm thick n-type GaAs substrate 20 (they form a dummy substrate). After that, sequentially grown thereon are: a 0.2 μm thick InGaP etching stop layer 23; a 0.1 μm thick GaAs contact layer 7; a 0.7 μm thick InAl/GaAlAs reflective layer 8; a 1.0 μm thick $In_{0.5}Al_{0.5}P$ n-type clad layer 9; a 1.0 μm thick active layer having a MQW structure of InGaAlP compound materials; a 1.0 μm $In_{0.5}Al_{0.5}P$ p-type clad layer 11; a 1.5 μm thick p-type InGaAlP current diffusion layer 12; and a 0.05 μm thick p-type InGaP bonding layer 13. The resulting structure is called a first intermediate semiconductor element.

Figure 7:
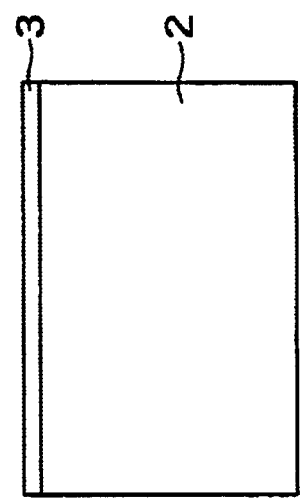
FIG. 7 is a cross-sectional view of the semiconductor light emitting device according to the same embodiment of the invention under a manufacturing process.

(2) As shown in FIG. 7, separately prepared is a structure in which a high-concentrated p-type GaP layer (buffer layer) 3 is epitaxially grown to the thickness of 0.2 μm on a p-type GaP transparent substrate 2 (approximately 250 μm thick). This is called a second intermediate semiconductor element.

Figure 9:
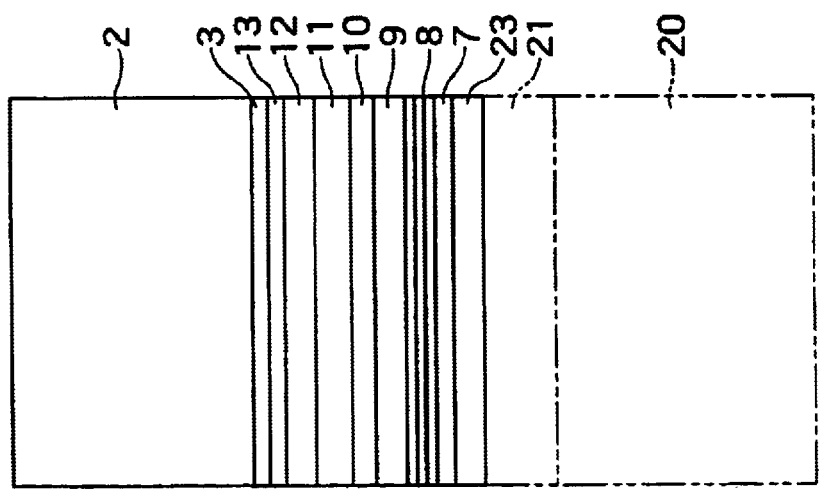
FIG. 9 is a cross-sectional view of the semiconductor light emitting device according to the same embodiment of the invention under a manufacturing process.

(3) Next referring to FIG. 9, the bonding layer 13 of the first intermediate semiconductor element (FIG. 6), washed with water and dried, and the high-concentrated p-type GaP layer 3 of the second intermediate semiconductor element (FIG. 7), washed and dried, are stacked. Then the first and second intermediate semiconductor elements stacked together are annealed at a moderate temperature, for example at 400° C., and temporarily bonded.

(4) Next as shown in FIG. 9, the temporarily bonded first and second intermediate semiconductor elements are etched with an ammonium-based etching liquid to selectively remove the dummy substrate composed of the n-type GaAs substrate 20 and the n-type GaAs buffer layer 21 up to this side of the InGaP etching stop layer 23.

Figure 10:
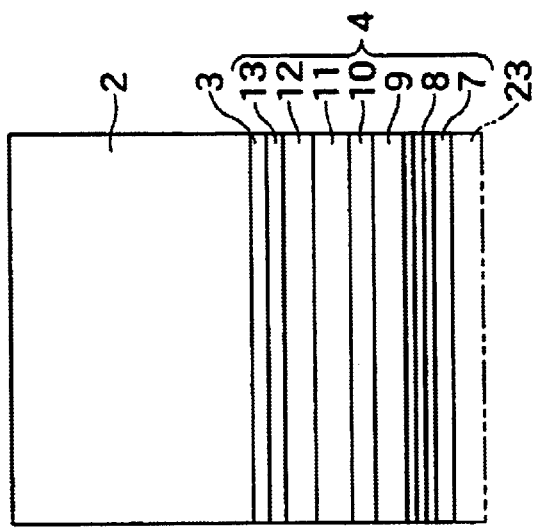
FIG. 10 is a cross-sectional view of the semiconductor light emitting device according to the same embodiment of the invention under a manufacturing process.

(5) Next as shown in FIG. 10, the InGaP etching stop layer 23 is removed by using a hydrochloric acid-based etching liquid. Consecutively, the intermediate semiconductor element is heated approximately to 770° C. and annealed to more firmly bond the bonding layer 13 and the high-concentrated p-type GaP layer 3.

Figure 11:
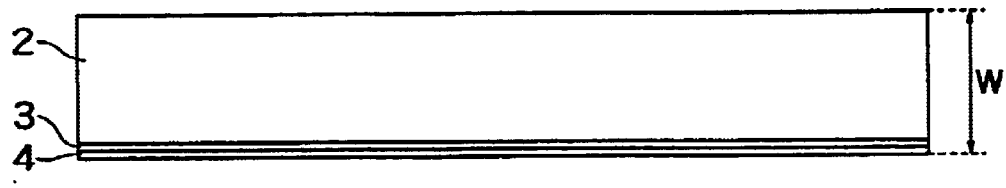
FIG. 11 is a cross-sectional view of the semiconductor light emitting device according to the same embodiment of the invention under a manufacturing process.

(6) The intermediate semiconductor element of FIG. 10 is shown in FIG. 11 in a changed ratio. FIG. 11 shows the intermediate semiconductor element in a configuration closer to its actual shape, namely, in a ratio between the vertical and horizontal scales different from the ratio of the intermediate semiconductor element shown in FIGS. 4 and 5 to be shorter in the vertical length (thickness). The thickness W is approximately 250 μm.

Figure 12:
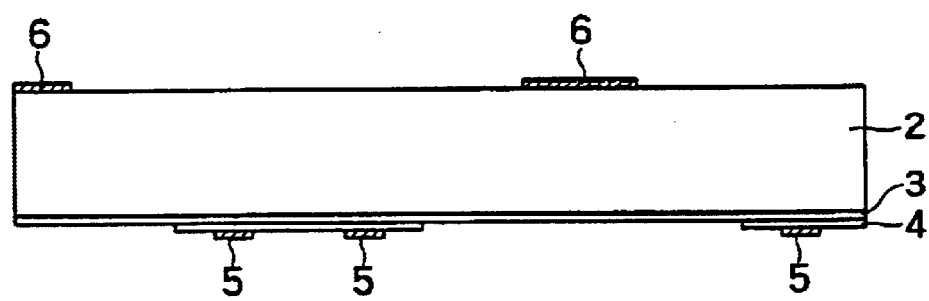
FIG. 12 is a cross-sectional view of the semiconductor light emitting device according to the same embodiment of the invention under a manufacturing process.

(7) Next as shown in FIG. 12, the semiconductor epitaxial layer 4 is shaped into a predetermined pattern by using photolithography. Next formed on the patterned semiconductor epitaxial layer 4 is the electricity-conducting ohmic electrode (n-side electrode) 5 by photolithography. Also on the upper outer surface of the p-type GaP transparent substrate 2, the electricity-conducting ohmic electrode (p-side electrode) 6 is formed by photolithography.

Figure 13:
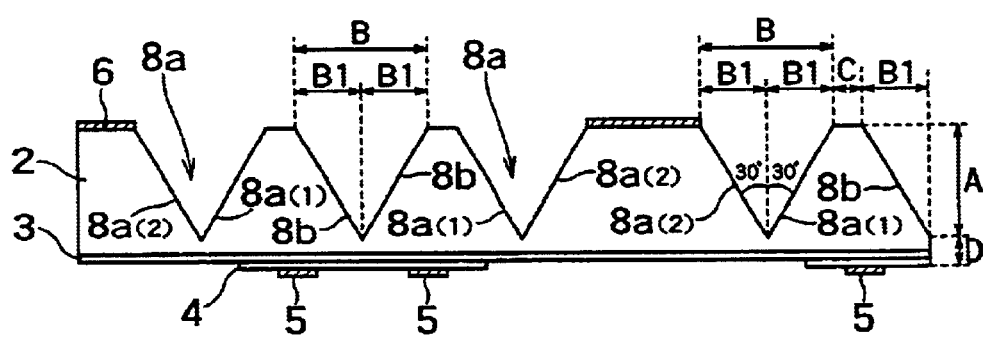
FIG. 13 is a cross-sectional view of the semiconductor light emitting device according to the same embodiment of the invention under a manufacturing process.

(8) Next as shown in FIG. 13, the upper outer surface of the p-type GaP transparent substrate 2 is cut to form V-shaped grooves by using a V-shaped (wedge-shaped) dicing saw having the angle of 60°. Broken layers (not shown) on surfaces of the V-shaped grooves are removed by a hydrochloric acid-based etching liquid. Thereafter, for the purpose of enhancing the light extraction efficiency, the V-shaped grooves undergoes frost processing by a hydrochloric acid-based etchant similar to the former etchant. Through these steps, the grooves 8a are made out as shown in FIG. 13. As shown here, depth A of each groove 8a is 200 μm, and width of the opening made by the groove 8a is 230 μm. Widths B1 in the right and left of the ridgeline of each groove 8a are 115 μm respectively. As apparent from FIG. 13, width C is 50 μm, and width D is 50 μm. The grooves 8a are formed to extend not only vertically to the sheet plane of FIG. 13 but also in parallel to the sheet plane (see FIG. 17).

Figure 14:
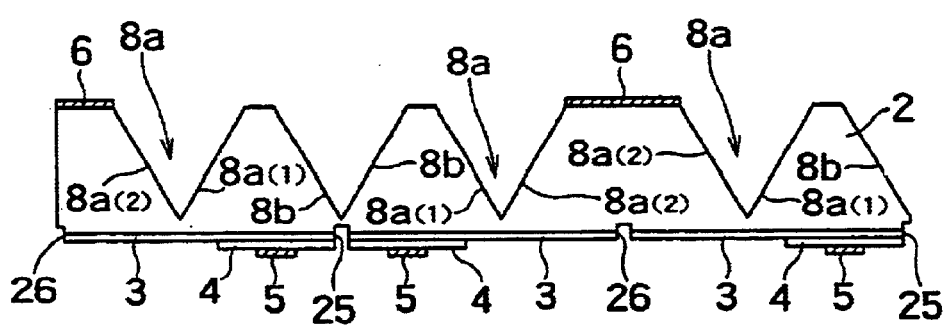
FIG. 14 is a cross-sectional view of the semiconductor light emitting device according to the same embodiment of the invention under a manufacturing process.

(9) Next as shown in FIG. 14, the semiconductor epitaxial layer 4, high-concentrated p-type GaP layer 3 and p-type GaP transparent substrate 2 are selectively etched by photolithography to form grooves 25, 26.

Figure 15:
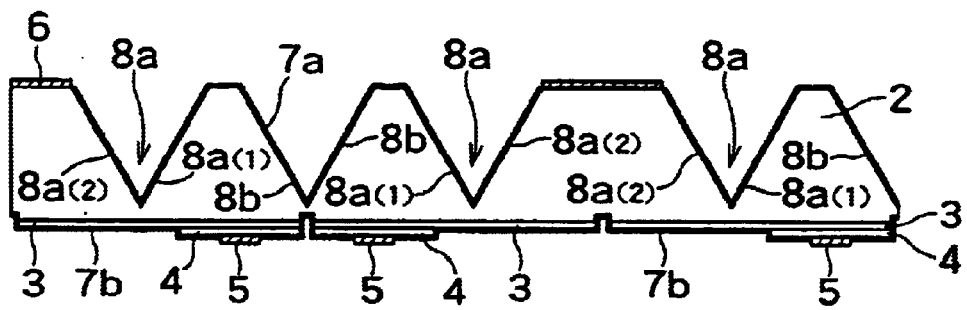
FIG. 15 is a cross-sectional view of the semiconductor light emitting device according to the same embodiment of the invention under a manufacturing process.

(10) Next as shown in FIG. 15, the oxide 7b of silicon dioxide ($SiO_2$), for example, is formed by using a solution containing acetic acid and acid, for example, on side surfaces of the semiconductor epitaxial layer 4, high concentrated p-type GaP layer 3 and p-type GaP transparent substrate 2 and the bottom of the lower surface of the p-type GaP transparent substrate 2. In this case, as appreciated from FIG. 15, the oxide 7b is not formed on lower surfaces of the n-side electrodes 5. Additionally, the oxide (insulating film) 7a is formed in the same manner on surfaces of the grooves 8a, inclined surfaces 8b, and so on, as shown in FIG. 15.

Figure 16:
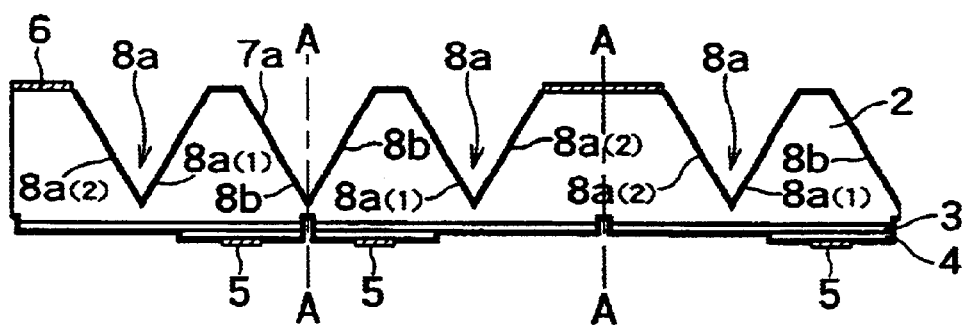
FIG. 16 is a cross-sectional view of the semiconductor light emitting device according to the same embodiment of the invention under a manufacturing process.
Figure 17:
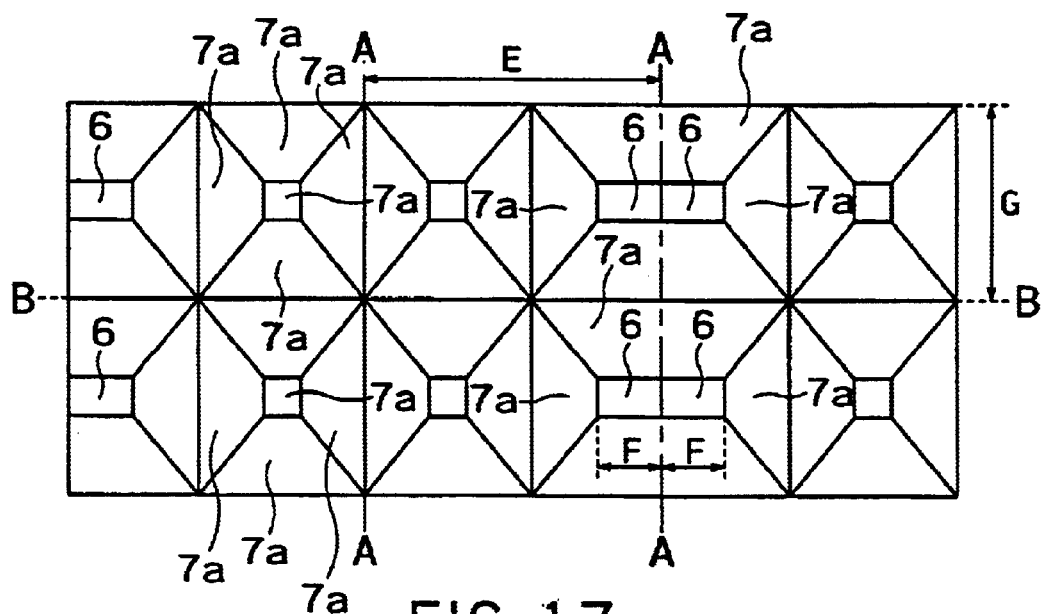
FIG. 17 is a top view of the semiconductor light emitting device according to the same embodiment of the invention under a manufacturing process.

(11) Next as shown in FIGS. 16 and 17, the intermediate semiconductor element shown in FIG. 15 is cut along A—A lines on an adhesive sheet to hold the cut pieces in alignment. As shown in FIG. 17, the cut width E is 495 μm, and the width F of the p-side electrode 6 is 100 μM. FIG. 17 is a top view of the intermediate semiconductor element shown in FIG. 16. After that, as shown in FIG. 17, the intermediate semiconductor elements cut along the A—A lines are again cut along B—B lines into chips (semiconductor light emitting elements). The cut width G is 330 μm as shown in FIG. 17. At this stage, all chips are held on the sheet not to drop separately.

Figure 18:
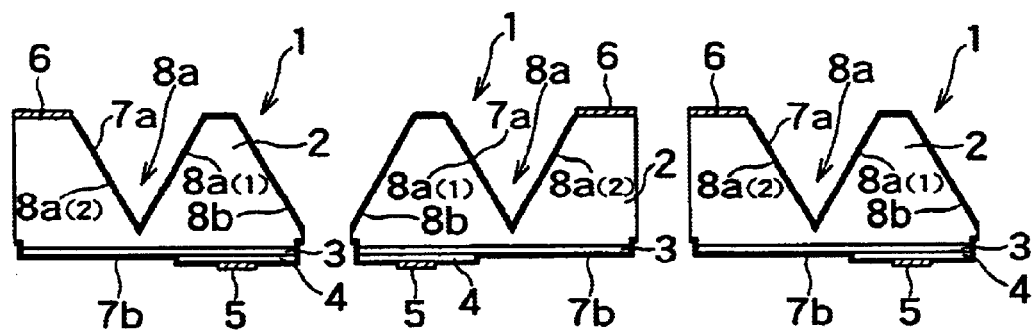
FIG. 18 is a cross-sectional view of the semiconductor light emitting device according to the same embodiment of the invention under a manufacturing process.
Figure 19:
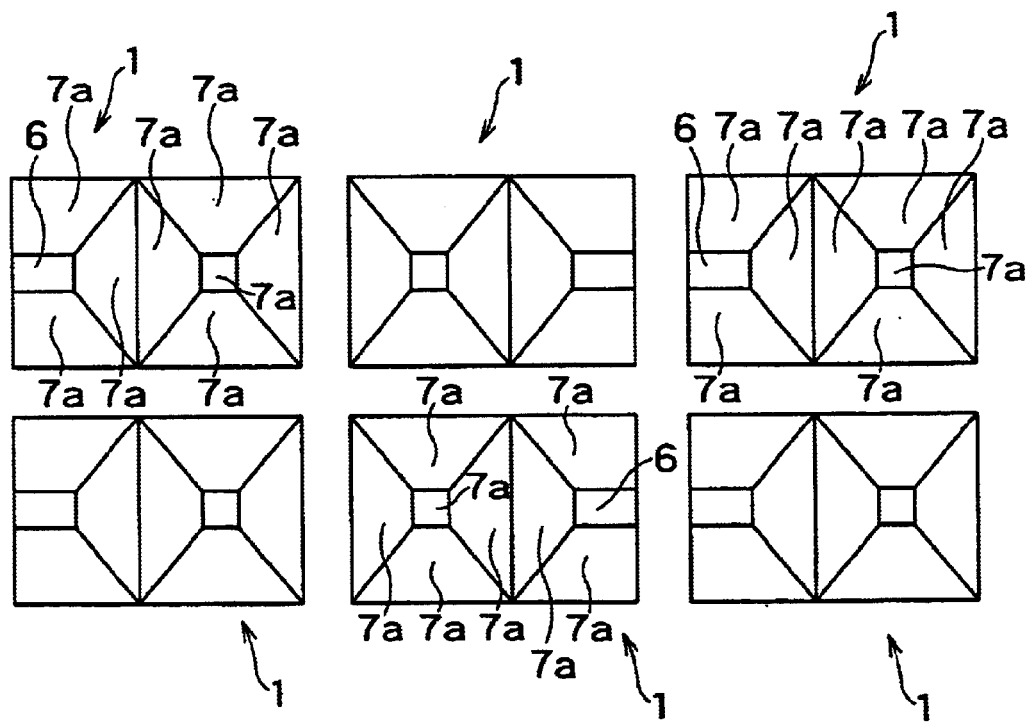
FIG. 19 is a cross-sectional view of the semiconductor light emitting device according to the same embodiment of the invention under a manufacturing process.

(12) Finally, as shown in FIGS. 18 and 19, the sheet supporting the intermediate semiconductor elements thereon is expanded to put spaces between adjacent semiconductor elements already cut, and individual semiconductor elements are detached from the adhesive sheet.

Through the above-explained process, the semiconductor light emitting element 1 shown in FIGS. 1 through 3 is completed, and the semiconductor light emitting device 15 shown in FIG. 5 is obtained by mounting the semiconductor light emitting element on the reflector 15.

The semiconductor light emitting element shown in FIGS. 1 through 3 and the semiconductor light emitting device shown in FIG. 5, which are obtained by the manufacturing process explained above, ensure the following effects. In the explanation made below, reference numerals shown in FIG. 5 are used.

Figure 20:
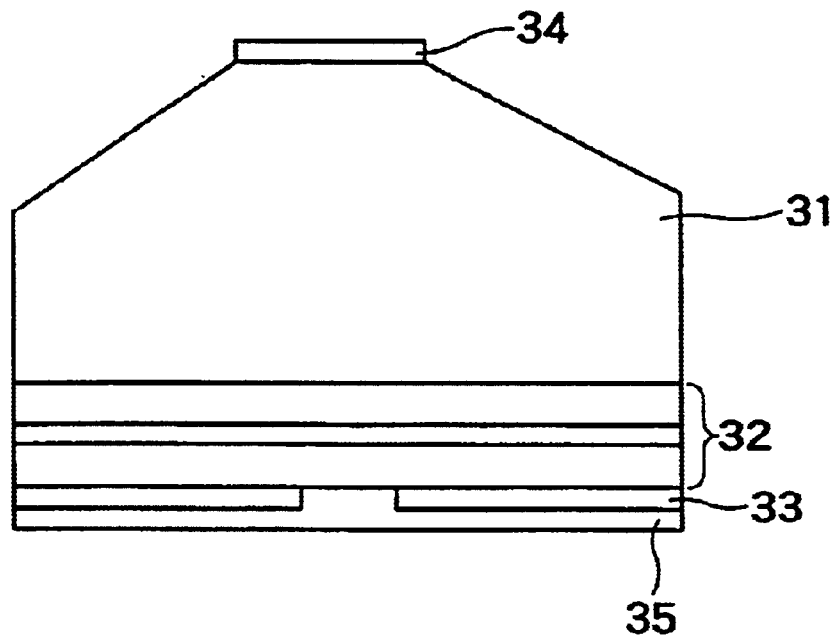
FIG. 20 is a cross-sectional view of an existing semiconductor light emitting element.

First of all, since the element and the device according to embodiments of the invention uses a transparent substrate as the substrate 2, and shape the upper portion of the semiconductor epitaxial layer on the transparent substrate 2 quasi hemispherical, the light extraction efficiency is enhanced. Further, in these embodiments, the opaque p-side electrode does not interrupt rays of light L1 through L4 emitted from the semiconductor epitaxial layer 4. Therefore, as compared with the existing element (FIG. 20) higher light extraction efficiency is ensured. In contrast, the existing element (FIG. 20) suffered insufficient light extraction efficiency because the light emitted from the emission diode layer 32 was partly interrupted by the opaque ohmic electrode 34.

In addition, the above-explained embodiment of the invention include the V-shaped groove 8a in the p-type GaP transparent substrate 2 and thereby optically interrupt the light path to right and left parts in the drawing. Therefore, the groove 8a prevents light emitted from the emission layer 14 on the right side of the groove 8a from entering into the below the p-side electrode 6 on the left side of the groove 8a, and can efficiently extracts the light externally from the element. Thus the light extraction efficiency is enhanced from this viewpoint as well. Furthermore, since the oxide 7a is formed on the other surface 8a(2) of the V-shaped groove 8a and enhances the reflectance of this surface, the light extraction efficiency is further enhanced.

The above-explained embodiments use a GaP substrate as the substrate 2 forming the groove 8a. The GaP substrate is moderately hard and easy to form the groove 8a therein. Therefore, it is ensured to form the groove 8a in reliable accordance with the designed value and reliably enhance the light extraction efficiency.

The above-explained embodiments provide the reflective layer 8 in the semiconductor epitaxial layer 4 (FIGS. 2 and 5). Therefore, rays of light emitted downward in the drawing from the active layer 10 reflect upward by the reflective layer 8 and has it extracted from the top of the element. As a result, the light extraction efficiency is enhanced further.

The above-explained embodiments of the invention provide the oxide 7b on the bottom surface of the element 1 in the drawing, and adjust the thickness of the oxide 7b to be odd number times of λ/4n where λ is the emission wavelength and n is the refractive index of the oxide. Therefore, after the oxide 7b permits a part of light traveling downward of the element to efficiently pass therethrough, the mounting material reflects it, such that it is extracted from the top surface of the element in the drawing. Thereby, the light extraction efficiency is further enhanced.

As explained above, the embodiments of the invention can enhance the light extraction efficiency.

Moreover, the embodiments explained above use InGaAlP compound semiconductors as the p-type (first conduction type) semiconductor layers 13 through 11, active layer 10 and n-type (second conduction type) semiconductor layer 9. Since InGaAlP compound semiconductors are those of a direct gap semiconductor, the use of InGaAlP compound semiconductors contributes to enhancement of the internal emission efficiency of the active layer 10. The InGaAlP compound semiconductors herein pertain to semiconductors expressed by the composition formula $In_xGa_yAl_{1-x-y}P$ ($0 \leq x \leq 1$, $0 \leq y \leq 1$ and $0 \leq 1-x-y \leq 1$), lattice-matching with the GaAs substrate, and having a lattice constant with a difference within 1% from that of GaAs.

However, the InGaAlP compound semiconductor layers 9 through 13 are different in lattice constant from the GaP substrate 2, and it is difficult to form them directly on the GaP substrate 2. If the InGaAlP compound semiconductor layer 9 through 13 are formed directly on the GaP substrate 2, this results in degrading their crystalline properties and reducing the internal emission efficiency of the active layer 10. Therefore, the embodiments of the invention first form the InGaAlP compound semiconductor layer 9 through 13 on the GaAs substrate 20 in lattice matching (FIG. 6), next bonds the transparent GaP substrate 2 to the InGaAlP compound semiconductor (FIG. 8), and thereafter removes the opaque GaAs substrate 20 (FIG. 9). Thereby, it is possible to enhance the internal emission efficiency of the active layer 10 while ensuring satisfactory crystalline properties of the InGaAlP compound semiconductor layers 9 through 13.

As reviewed above, the element and the device according to embodiments of the invention can not only enhance the light extraction efficiency but also enhance the internal emission efficiency. As a result, the light output can be enhanced.

Furthermore, the above-explained embodiments locate the p-side electrode 6 and the n-side electrode 5 on and under the substrate 2 to interpose a distance between the p-side electrode 6 and the n-side electrode 5. Therefore, the current from the p-side electrode 6 is injected to the semiconductor epitaxial layer 4 while spreading out from the left top toward the right bottom in FIG. 5. As a result, emission of the semiconductor epitaxial layer 4 can be uniformed over its plane. In contrast, the existing element (FIG. 21) configured to inject a current to the light emitting portion substantially directly abeam, and suffers uneven emission.

Figure 21:
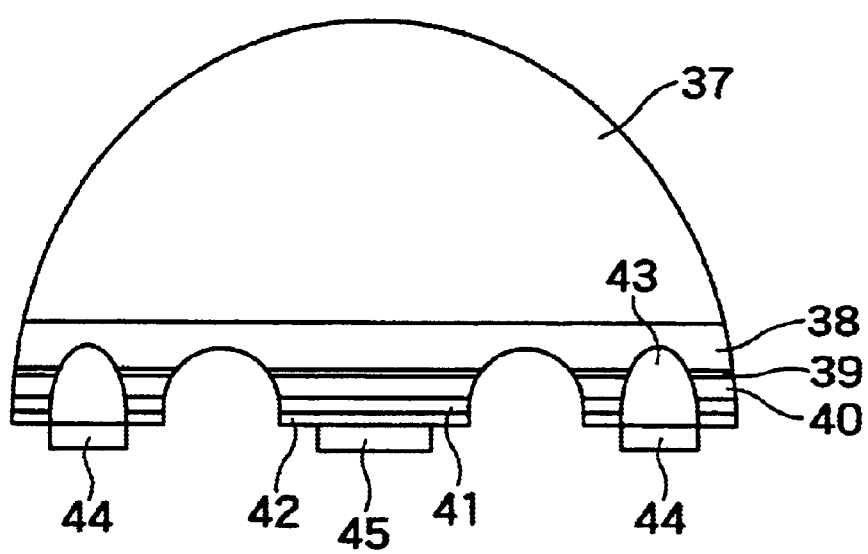
FIG. 21 is a cross-sectional view of another existing semiconductor light emitting element.

Moreover, since the embodiments locate the p-side electrode 6 and the n-side electrode 5 on and under the substrate 2, they do not need the groove or Zn diffusion region 43 that were indispensable in the existing element shown in FIG. 21 to isolate respective elements. Therefore, productivity of elements and devices can be improved.

Additionally, the embodiments of the invention cover side surfaces of the semiconductor epitaxial layer 4 with the oxide 7b. Therefore, they prevent the mounting material 16a from short-circuiting the p-type semiconductor layers 13 through 11 and n-type semiconductor layer 9 on opposite surfaces sandwiching the active layer 10, and thereby ensure reliable operations of the element 1. This feature enhances the production yield and the productivity.

Further, the embodiments provide an ample margin for location of the n-side electrode 5 relative to the reflector 15. Also from this point of view, the embodiments enhance the production yield and the productivity.

As reviewed above, the embodiments of the invention can enhance the production yield and the productivity.

Thus the embodiments of the invention provide a semiconductor light emitting element and a semiconductor light emitting device that are high in light output, uniform in emission, and high in production yield and productivity.

In the embodiments explained above, the buffer layer 3 is preferably made of a GaP compound semiconductor. The use of a GaP compound semiconductor contributes to favorable crystal growth on the GaP substrate 2. The GaP compound semiconductor herein pertains to any semiconductor containing Ga and P as its major components, lattice-matching with the GaP substrate, and having a lattice constant with a difference within 1% from that of the GaP substrate. It is also acceptable to directly bond the semiconductor epitaxial layer 4 to the substrate 2 without interposing the buffer layer 3.

The n-type contact layer 7 is preferably made of a GaAs compound semiconductor. The use of a GaAs compound semiconductor contributes to satisfactory crystal growth on the GaAs substrate 20 (FIG. 6) and to make the ohmic contact between the n-type contact layer 7 and the n-side electrode 5 easier. The GaAs compound semiconductor herein pertains to any semiconductor containing GaAs as its major components, lattice-matching with the GaAs substrate, and having a lattice constant with a difference within 1% from that of the GaAs substrate.

Although the embodiments explained above provide the reflective layer 8 in the semiconductor epitaxial layer 4 (FIG. 2), they may omit the reflective layer 8. In this case, light emitted from the active layer 10 downward in the drawing in the device shown in FIG. 5 first passes through the oxide 7b formed on the lower surface of the semiconductor epitaxial layer 4, it is reflected upward by the mounting material 16a, and extracted from the top surface of the element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concepts as defined by the appended claims and their equivalents.

What is claimed is:

1. A semiconductor light emitting element comprising:
a transparent first conduction type substrate having a first surface and a second surface opposed to each other and being transparent to light of a wavelength λ;
a semiconductor epitaxial layer on or above a location of the first surface of the substrate directly or via a buffer layer, and including a semiconductor layer of the first conduction type formed in electrical connection with the substrate, an active layer formed on the semiconductor layer of the first conduction type to emit light of the wavelength λ and a semiconductor layer of a second conduction type formed on the active layer;
a first electrode formed in electrical connection with the semiconductor layer of the second conduction type of the semiconductor epitaxial layer on a location of a surface of the semiconductor epitaxial layer opposite from the substrate;
a second electrode formed in electrical connection with the substrate on a location of the second surface of the substrate offset from alignment with the first electrode; and
a groove formed to indent from the second surface of the substrate toward the first surface thereof in a location between the first electrode and the second electrode.

2. A semiconductor light emitting element according to claim 1 wherein the groove has a pass-through surface portion permitting the light from the active layer to pass through leaving the substrate and a reflective surface portion for reflecting light passing through the pass-through surface potion.

3. A semiconductor light emitting element according to claim 1 wherein the groove is wedge-shaped.

4. A semiconductor light emitting element according to claim 1 wherein side surfaces of the semiconductor epitaxial layer are covered with an insulating material.

5. A semiconductor light emitting element according to claim 1 wherein an insulating film is formed on side surfaces of the semiconductor epitaxial layer, a part of the surface of the semiconductor epitaxial layer opposite from the substrate excluding the surface covered with the first electrode, and the first surface of the substrate or the buffer layer.

6. A semiconductor light emitting element according to claim 5 wherein the insulating film is made of a material transparent to light of the wavelength $\lambda$ from the active layer, and wherein the insulating film is adjusted in thickness to be odd number times of $\lambda/4n$ where n is the refractive index of the insulating film.

7. A semiconductor light emitting element according to claim 1 wherein the semiconductor epitaxial layer is formed on a location of the first surface of the substrate via the buffer layer.

8. A semiconductor light emitting element according to claim 1 wherein the semiconductor layer of the first conduction type, the active layer and the semiconductor layer of the second conduction type, included in the semiconductor epitaxial layer are made of InGaAlP compound semiconductor.

9. A semiconductor light emitting element according to claim 1 wherein the substrate is a GaP substrate.

10. A semiconductor light emitting device comprising:
a semiconductor light emitting element having:
a transparent first conduction type substrate having a first surface and a second surface opposed to each other and being transparent to light of a wavelength $\lambda$;
a semiconductor epitaxial layer on or above a location of the first surface of the substrate directly or via a buffer layer, and including a semiconductor layer of the first conduction type formed in electrical connection with the substrate, an active layer formed on the semiconductor layer of the first conduction type to emit light of the wavelength $\lambda$ and a semiconductor layer of a second conduction type formed on the active layer;
a first electrode formed in electrical connection with the semiconductor layer of the second conduction type of the semiconductor epitaxial layer on a location of a surface of the semiconductor epitaxial layer opposite from the substrate;
a second electrode formed in electrical connection with the substrate on a location of the second surface of the substrate offset from alignment with the first electrode; and
a groove formed to indent from the second surface of the substrate toward the first surface thereof in a location between the first electrode and the second electrode;
a reflector; and
an electrically conductive mounting material for mounting the first electrode of the semiconductor light emitting element on the reflector.

11. A semiconductor light emitting device according to claim 10 wherein the groove has a pass-through surface portion permitting the light from the active layer to pass through leaving the substrate and a reflective surface portion for reflecting light passing through the pass-through surface potion.

12. A semiconductor light emitting device according to claim 10 wherein the groove is wedge-shaped.

13. A semiconductor light emitting device according to claim 10 wherein side surfaces of the semiconductor epitaxial layer are covered with an insulating material.

14. A semiconductor light emitting device according to claim 10 wherein an insulating film is formed on side surfaces of the semiconductor epitaxial layer, a part of the surface of the semiconductor epitaxial layer opposite from the substrate excluding the surface covered with the first electrode, and the first surface of the substrate or the buffer layer.

15. A semiconductor light emitting device according to claim 14 wherein the insulating film is made of a material translucent to light of the wavelength $\lambda$ from the active layer, and wherein the insulating film is adjusted in thickness to be odd number times of $\lambda/4n$ where n is the refractive index of the insulating film.

16. A semiconductor light emitting device according to claim 10 wherein the semiconductor epitaxial layer further includes a reflective layer of the second conduction type on the semiconductor layer of the second conduction type to reflect light of the wavelength $\lambda$.

17. A semiconductor light emitting device according to claim 10 wherein the semiconductor layer of the first conduction type, the active layer and the semiconductor layer of the second conduction type included in the semiconductor epitaxial layer are made of InGaAlP compound semiconductor, and wherein the substrate is a GaP substrate.

18. A semiconductor light emitting device comprising:
a semiconductor light emitting element having:
a GaP substrate of a first conduction type, having a first surface and a second surface opposed to each other and being translucent to light of a wavelength $\lambda$;
a semiconductor epitaxial layer on or above a location of the first surface of the substrate via a buffer layer of a GaP compound semiconductor, and including a semiconductor layer of the first conduction type formed in electrical connection with the GaP substrate, an active layer formed on the semiconductor layer of the first conduction type to emit light of the wavelength $\lambda$, a semiconductor layer of a second conduction type formed on the active layer, a reflective layer of the second conduction type formed on the semiconductor layer of the second conduction type to reflect light of the wavelength $\lambda$, and a contact layer of the second conduction type formed on the reflective layer, wherein the semiconductor layer of the first conduction type, the active layer and the semiconductor layer of the second conduction type being made of InGaAlP compound semiconductor and being different in lattice constant and material from the GaP substrate, the contact layer of the second conduction type being made of a GaAs compound semiconductor;
a first electrode formed on a location of the contact layer of the second conduction type in electrical connection therewith;
a second electrode formed on a location of the second surface of the substrate in electrical connection therewith; and
a wedge-shaped groove formed to indent from the second surface of the substrate toward the first surface thereof in a location between the first electrode and the second electrode, and having a pass-through surface portion permitting the light from the active layer to pass through leaving the substrate and a reflective surface portion for reflecting light passing through the pass-through surface potion;

a reflector; and an electrically conductive mounting material for mounting the first electrode of the semiconductor light emitting element on the reflector.

* * * * *